(12) United States Patent
Sato

(10) Patent No.: US 7,317,246 B2
(45) Date of Patent: Jan. 8, 2008

(54) PACKAGE FOR ELECTRONIC DEVICE AND METHOD FOR MANUFACTURING ELECTRONIC DEVICE

(75) Inventor: Takashi Sato, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 22 days.

(21) Appl. No.: 11/427,570

(22) Filed: Jun. 29, 2006

(65) Prior Publication Data

US 2007/0001288 A1 Jan. 4, 2007

(30) Foreign Application Priority Data

Jul. 4, 2005 (JP) ............................ 2005-194646

(51) Int. Cl.
*H01L 23/52* (2006.01)
(52) U.S. Cl. ...................................... 257/691; 438/106
(58) Field of Classification Search ................ 257/691, 257/698, 701, 704, 728; 438/106, 112, 612
See application file for complete search history.

(56) References Cited

U.S. PATENT DOCUMENTS

2004/0183191 A1* 9/2004 Hamada ..................... 257/728
2005/0269911 A1 12/2005 Usada

FOREIGN PATENT DOCUMENTS

JP    A 2000-77943    3/2000
JP    A 2005-175848    6/2005

* cited by examiner

*Primary Examiner*—Phuc T. Dang
(74) *Attorney, Agent, or Firm*—Oliff & Berridge, PLC

(57) ABSTRACT

A package for an electronic device equipped with an external terminal other than a terminal for mounting, includes a first internal terminal electrically connected to an external terminal other than the terminal for mounting and a second internal terminal connected to an external terminal for mounting for ground connection which is selectively connected to the internal terminal.

4 Claims, 4 Drawing Sheets

A-A

A-A

B-B

A-A

B-B

A-A

B-B

PACKAGE FOR ELECTRONIC DEVICE AND METHOD FOR MANUFACTURING ELECTRONIC DEVICE

BACKGROUND OF THE INVENTION

1. Technical Field

The invention relates to a package for an electronic device and a method for manufacturing an electronic device, and more particularly to a package for an electronic device and a method for manufacturing an electronic device which is equipped, as an internal part to be mounted, with an electronic component that enables data to be rewritable.

2. Related Art

A package of an electronic device has been subjected to various improvements to fit a function of the device, characteristics of an electronic component mounted therein and the like, and there have been developed packages of shapes and structures such as to suit respective specifications.

For example, a package disclosed in Japanese Unexamined Patent Publication No. 2000-77943 is a package for use with a piezo-electric oscillator with a configuration that enables information from outside to be rewritable with respect to an IC mounted therein. Specifically, as an external terminal of the package, a terminal for controlling the IC is provided in addition to a terminal for mounting a printed substrate and the like.

Improvements of such package structure have been necessarily carried out in terms of solving a current technical problem, and it is no exception when the patent applicant undertakes technical development. Actually, the patent applicant found a problem relating to the piezo-electric oscillator disclosed in the above-mentioned related art and succeeded, through various research, in developing a piezo-electric oscillator that can solve the above-mentioned problem.

The invention may be summarized as follows: a terminal for controlling the IC is used as a lid of the piezo-electrixc oscillator, so that risks such as short-circuiting when mounting the piezo-electric oscillator on the printed substrate and the like may be avoided.

Japanese Unexamined Patent Publication No. 2000-77943 is an example of related art.

A package used for an electronic device subjected to one improvement after another as mentioned above is considered highly effective for individual purposes. On the other hand, the fact is that a package structure of an electronic device specifically developed to solve one problem suffers poor usability for general purposes in manufacturing other electronic devices.

Actually, in a case of the package disclosed in Japanese Unexamined Patent Publication No. 2000-77943, when there is a request to use the external terminal for IC control for other purpose, there is a need to design newly an internal structure of the package.

SUMMARY

An advantage of the present invention is to provide a package that can give usability for general purposes to the package for an electronic device equipped with an external terminal other than a mounted terminal and to provide a method for manufacturing an electronic device that can use this package effectively.

A package for an electronic device according to one aspect of the invention is a package of an electronic device equipped with an external terminal other than a terminal for mounting which includes: a base, a plurality of mounting terminals which are disposed at an outer surface of a bottom of the base, a first external terminal disposed on an outer surface of the package, a first internal terminal electrically connected to the first external terminal being disposed inner the base, and a second internal terminal electrically connected to one of the mounting terminals for ground connection being disposed inner the base, wherein the second internal terminal is selectively connected to the first internal terminal. By employing a package of such configuration, a package to be manufactured may be made at least in two kinds; the one in which at least the internal terminals are connected between each other and the other in which the internal terminals are not connected to each other. As a result, it is possible to complete selectively a package having one basic configuration available in at least two kinds of package in the manufacturing stage. Namely, it is possible to provide usability for general purposes to a package having one basic configuration.

In the package for an electronic device of the above-mentioned configuration, it is preferable that a metallic wire be used for connection between the internal terminal and the second internal terminal. By connecting one internal terminal to another through so-called wire bonding using a metallic wire, the internal terminals can be easily connected to each other at the manufacturing stage of a package or an electronic device.

Further, a package for an electronic device according to another aspect of the invention is a package of an electronic device equipped with an external terminal other than a terminal for mounting, which may include: a base, a plurality of mounting terminals which are disposed at an outer surface of a bottom of the base, a first external terminal disposed on an outer surface of the package, and a internal terminal disposed inner the base which is selectively divided to a first internal terminal electrically connected to the first external terminal and a second internal terminal connected to one of the mounting terminals for ground connection.

Even in case of a package of such configuration, the package to be manufactured may be at least in two kinds in which one type is such that at least the internal terminals are connected to each other, while other type being such that the internal terminals are not connected to each other. Consequently, it is possible to complete selectively a package having one basic configuration available in at least two kinds of package in the manufacturing stage. Namely, it is possible to provide usability for general purposes to a package having one basic configuration.

Furthermore, in the package for an electronic device of the above-mentioned configuration, it is preferable to use an external terminal other than the terminal for mounting as a package lid. By constructing the package lid in such a way as to connect it to the ground, shield effect can be expected.

A method of manufacturing an electronic device according to yet another aspect of the invention, the method being for manufacturing an electronic device using a package for an electronic device according to either aspect mentioned above, includes selectively implementing, corresponding to a specification of an electronic component to be mounted inside the package, an electrical connection between an electronic component and an internal terminal electrically connected to an external terminal other than the terminal for mounting, and an electrical connection between the first internal terminal electrically connected to the external terminal other than the terminal for mounting and the second internal terminal electrically connected to the external terminal for mounting for ground connection.

In this case, by using a package having one basic structure, it is possible to manufacture two electronic components having a package fit to a specification of the electronic component. Therefore, the above-mentioned package for an electronic device can be effectively used.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
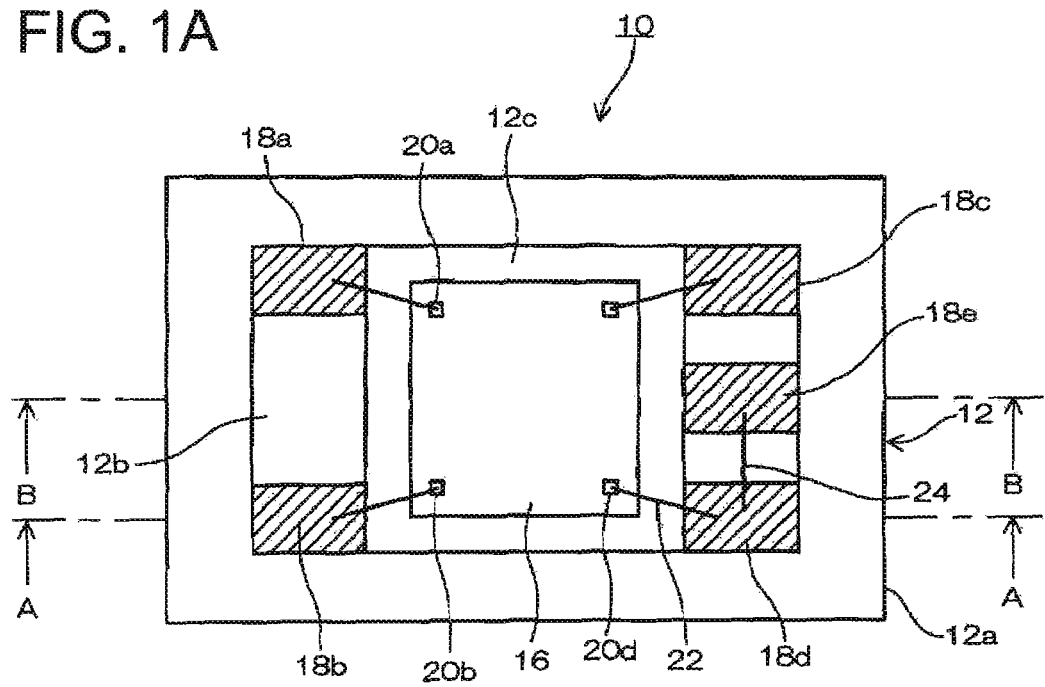
FIGS. 1A to 1C are schematic diagrams that show a first specification example of a package for an electronic device according to a first embodiment.

A package for an electronic device of embodiments of the invention and a method for manufacturing an electronic device using this package will be described in detail as follows with reference to the drawings. Note that the embodiments shown below are preferred embodiments in implementing the invention, and a technical range of the invention is not bound only by the following embodiments.

First, with reference to FIGS. 1A to 1C and FIGS. 2A to 2C, a first embodiment according to a package for an electronic device of the invention will be described.

A package 10 of the embodiment is based on a basic constitution of a package base (hereinafter referred to as the "base") 12, in which an electronic component 16 is internally mounted, and a lid 14 that seals the base 12 in which the electronic component 16 is mounted.

The base 12 assumes a box shape formed of a plurality of substrates 12a to 12c consisting of insulating members such as ceramics, having a cavity and the like to mount the electronic component 16 therein. On the substrate making up each layer are provided metallic patterns, via holes, castellation and the like corresponding to designs.

The metallic patterns disposed on the base 12 may be roughly divided into the internal terminals 18 (18a-18e) which are disposed inside the base, the mounting terminal 26b and 26d (26a and 26c) which are disposed outside the base, and those which connect these terminals.

The via holes and castellation play a role of electrically connecting the internal terminals 18 to the mounting terminals 26. The base 12 to be used in the embodiment electrically connects the internal terminals 18a to 18d, which are disposed on the upper surface of a substrate 12b, to the mounting terminals 26a to 26d (26a and 26c not illustrated), which are disposed at the bottom of a substrate 12c, through a via hole (conductive member placed inside the via hole) 28. Further, the internal terminal 18e disposed inside the base 12 of the embodiment is electrically connected to a via hole 30 which leads to an opening on an upper part of the base 12.

The lid 14 to be used for the package 10 of the embodiment is made of a metal. If an element making up the base 12 is set as ceramic, it is preferable to select cobalt and the like having a close thermal expansion coefficient as a constituent member. By setting the lid 14 as metallic made, after the base 12 is sealed, the lid 14 itself may be made as one of the external terminals connected to the internal terminal 18e.

Figure 1B:
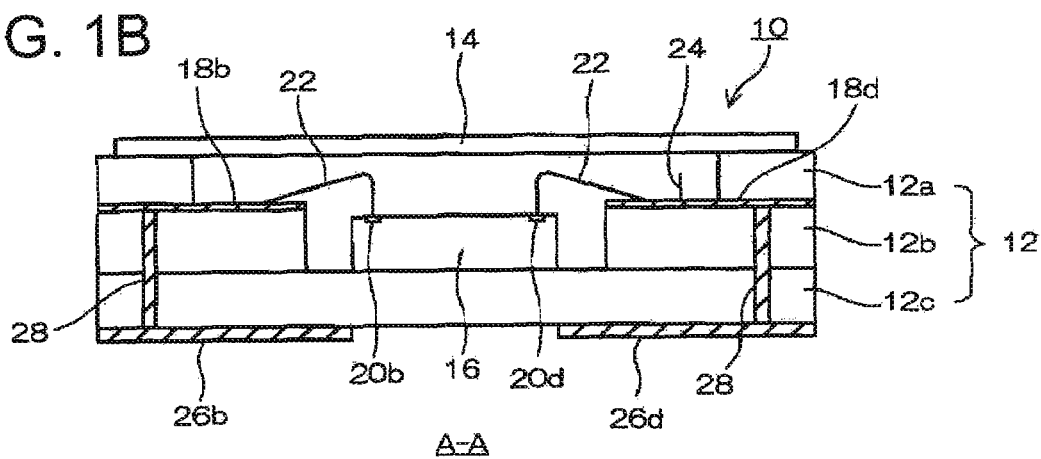
Figure 1C:
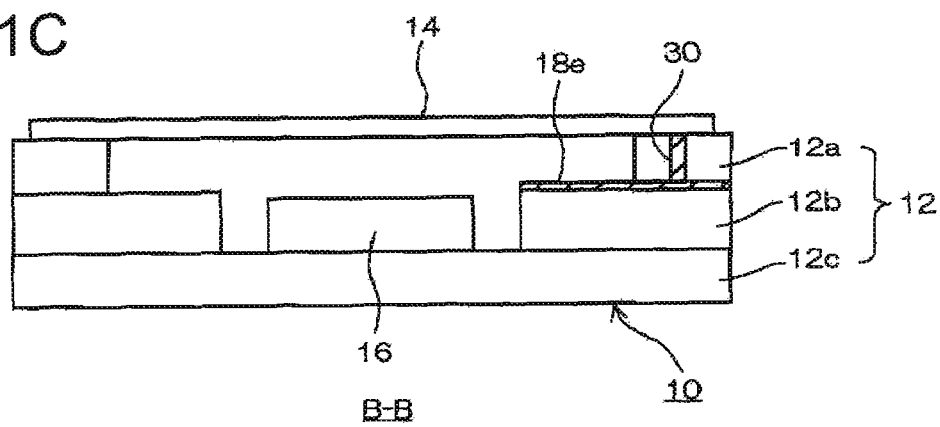

FIGS. 1A to 1C show an example of a case of employing, as an electronic component to be mounted inside the package 10, only those having basic connection pads (for example, a terminal for controlling an output signal from an electronic device, ST; ground terminal, GND; a terminal outputting a signal from the electronic device, OUT; and a terminal obtaining supply voltage, VDD) 20a to 20d and receiving a request from a customer for connecting the lid 14 provided as an external terminal to the ground (GND).

It should be noted that FIG. 1A is a schematic diagram that shows a plan view of the package, FIG. 1B being a schematic diagram that shows a section along line A-A in FIG. 1A, while FIG. 1C being a schematic diagram that shows a section along line B-B in FIG. 1A.

In such a case, first, an electronic component (for example, an IC) 16 is mounted in a cavity of the base 12. For mounting of the electronic component 16, use of an adhesive and the like not illustrated is acceptable. After mounting the electronic component 16 inside the base 12, a metallic wire 22 is used to electrically connect the internal terminals 18a to 18d to the connection pads 20a to 20d provided on the electronic component 16 (wire bonding).

When carrying out wire bonding, the connection pads 20a to 20d provided on the electronic component are connected to the internal terminals 18a to 18d that are connected to the mounting terminals (external terminals for mounting) 26a to 26d corresponding to respective settings. In the embodiment, the internal terminal 18e disposed adjacent to the internal terminal 18d which is connected to the mounting terminal 26d set as a terminal for GND connection, is set as an internal terminal electrically connected to the lid 14 after sealing the package 10.

Therefore, when there is a request such as mentioned above, by connecting the internal terminal 18e to the internal terminal 18d through the metallic wire 24, the lid 14 is connected to the GND terminal after sealing the package 10. By connecting the lid 14 to the GND, a shield effect against electromagnetic waves incident from outside the package 10 can be expected. Further, if the lid 14 made up of a metal is made to be in a state of electrically floating, an action as a so-called capacitor operates between the terminals disposed on the base 12, so that an electrostatic capacity accumulated there must be taken into consideration. However, this can be avoided by connecting the lid 14 to the GND, thus facilitating control of the electronic component 16 and the like.

Figure 2A:
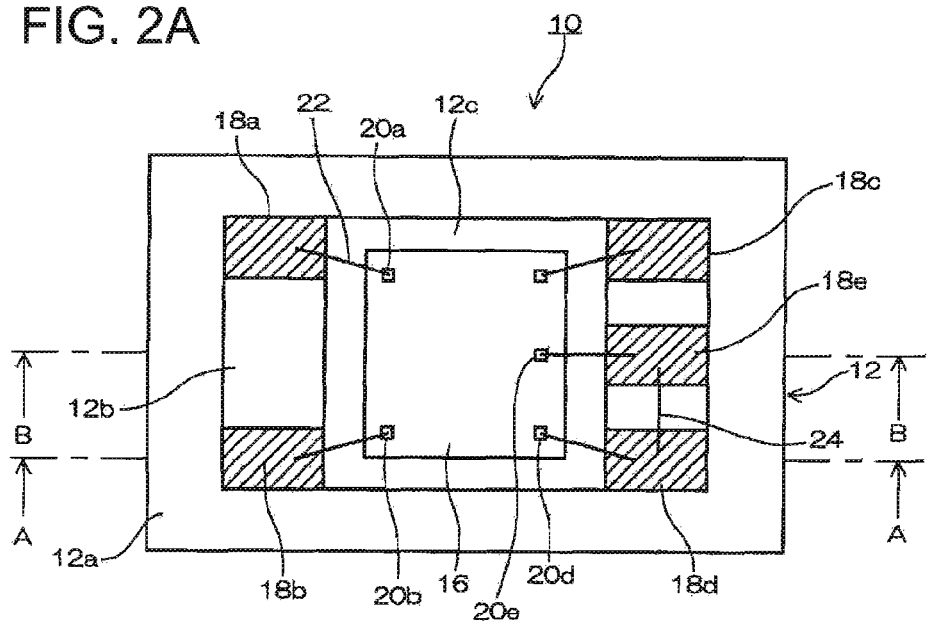
FIGS. 2A to 2C are schematic diagrams that show a second specification example of a package for an electronic device according to a second embodiment.
Figure 2B:
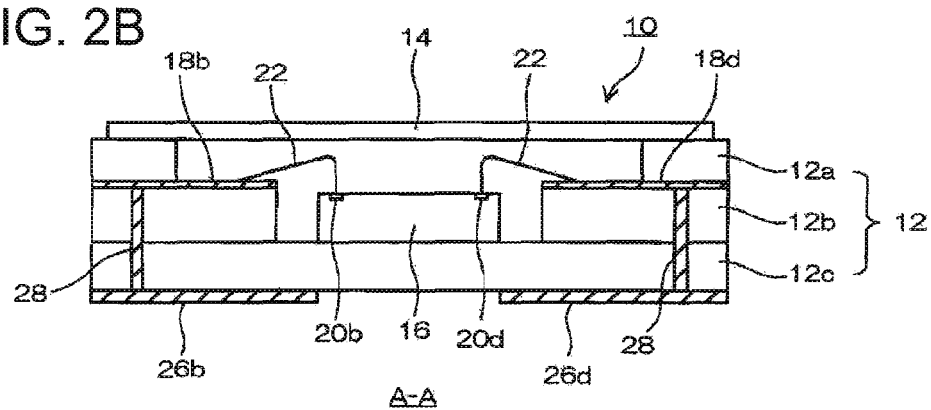
Figure 2C:
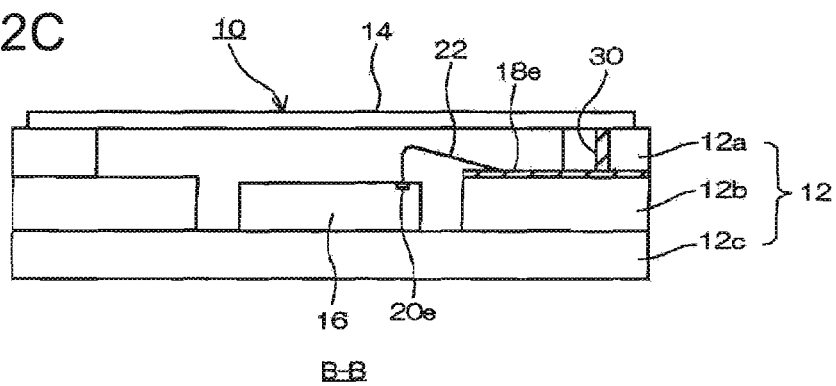

On the other hand, as shown in FIGS. 2A to 2C, if the electronic component 16 to be mounted is equipped with a connection pad other than the basic connection pads 20a to 20d (for example, a write control pad for rewriting information recorded inside the electronic component, such as PE), the package 10 of the embodiment is used as follows. It should be noted that FIG. 2A is a schematic diagram that shows a plan view of the package, FIG. 1B being a schematic diagram that shows a section along line A-A in FIG. 2A, while FIG. 1C being a schematic diagram that shows a section along line B-B in FIG. 2A.

A process of mounting the electronic component 16 in the cavity inside the base 12 is the same as the case shown in FIGS. 1A to 1C. Next, the connection pads 20a to 20e provided on the electronic component 16 and the internal terminals 18a to 18e are subjected to wire bonding and the electronic component 16 is mounted in the cavity.

In case of this example, it is configured such that the number of the connection pads provided on the electronic component 16 and the number of the mounting terminals 26 as well as the internal terminals 18 connected to the electronic component 16 are in agreement, the connection pads 20a to 20e being connected to the internal terminals 18 which are connected to the external terminals corresponding to respective purposes. In case of this example, the connection pad 20e set as the write control pad (PE) connects to the internal terminal 18e which is connected to the lid 14 that is set as an external terminal.

As mentioned in the above example, the package 10 of the embodiment is equipped with the internal terminal 18e which is electrically connected or to be so connected to the external terminal (lid) 14 other than the terminal for mounting and the external terminal (lid) 14, so that it is configured such as to connect the internal terminal 18e selectively to other internal terminal such as 18d as necessary. Through such configuration, it becomes possible to use the package 10, whose usage purpose was limited as it was specialized according to the property of the electronic component 16 mounted inside the package 10, as the package 10 that enables the electronic component 16 having other properties to be mounted. Accordingly, it is possible to endow the package 10 with usability for general purposes.

Figure 3A:
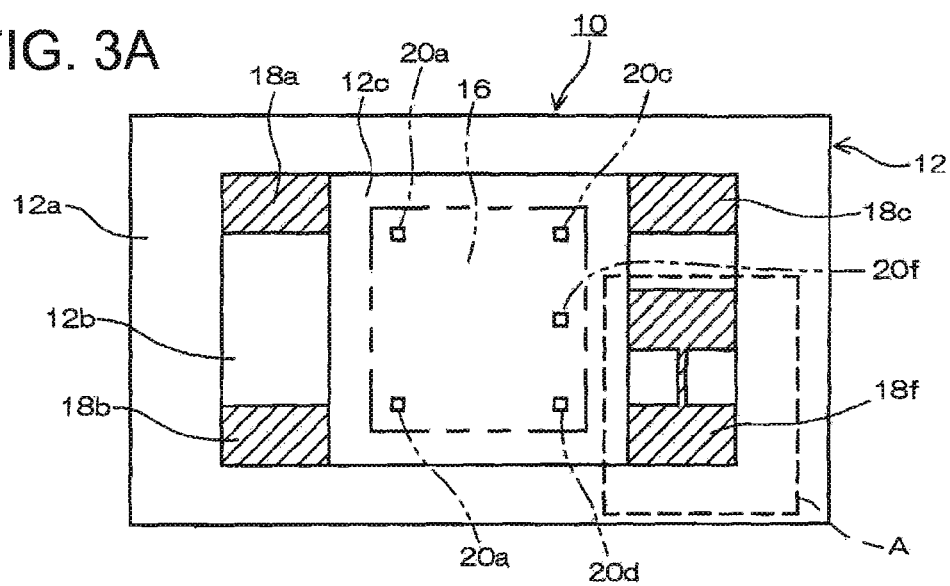
FIGS. 3A to 3C are schematic diagrams that shows a configuration of a package for an electronic device according to a second embodiment.
Figure 3B:
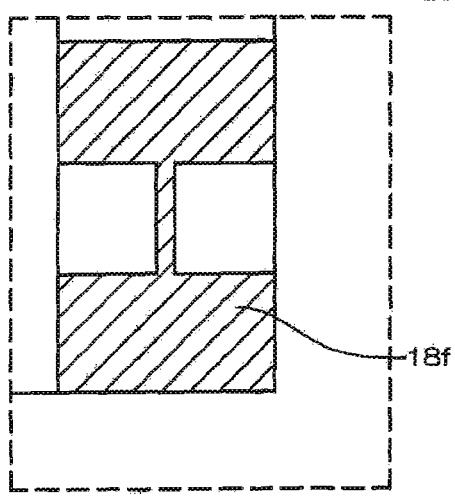

Next, a second embodiment according to a package for an electronic device of the invention will be described with reference to FIGS. 3A to 3C. It should be noted that FIG. 3A shows a plan view of the package, FIG. 3B showing an enlarged view of a section surrounded by broken lines in FIG. 3A. The basic structure of the package according to the embodiment is the same as the package structure according to the first embodiment mentioned above. Hence, like reference characters are given in the drawing for parts having like functions, whereby their descriptions are omitted.

The package 10 of the embodiment achieves the same effect as the package according to the first embodiment in which the internal terminals are selectively connected to each other corresponding to the package specification, by reversing a concept.

The package of the embodiment assumes a structure that connects a plurality of external terminals (for example, the lid 14 and the mounting terminal 26d disposed for GND connection) with respect to one internal terminal 18f disposed on the base. By taking such structure, the electronic component 16 having only the basic connection pads 20 which were cited as an example in the first embodiment is employed, whereas when there is a request of connecting the lid 14 to the ground, all that is needed is connecting the connection pad 20d for the ground of the electronic component 16 to the internal terminal 18f.

Figure 3C:
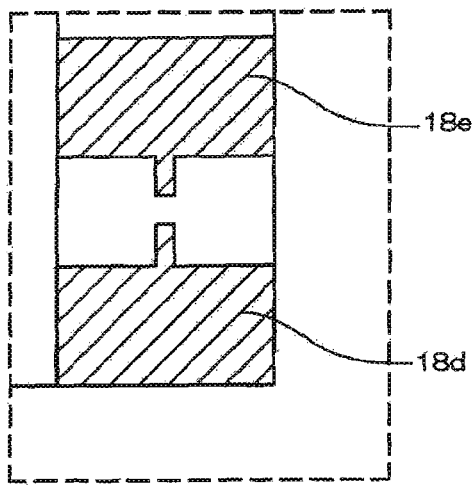
Figure 4A:
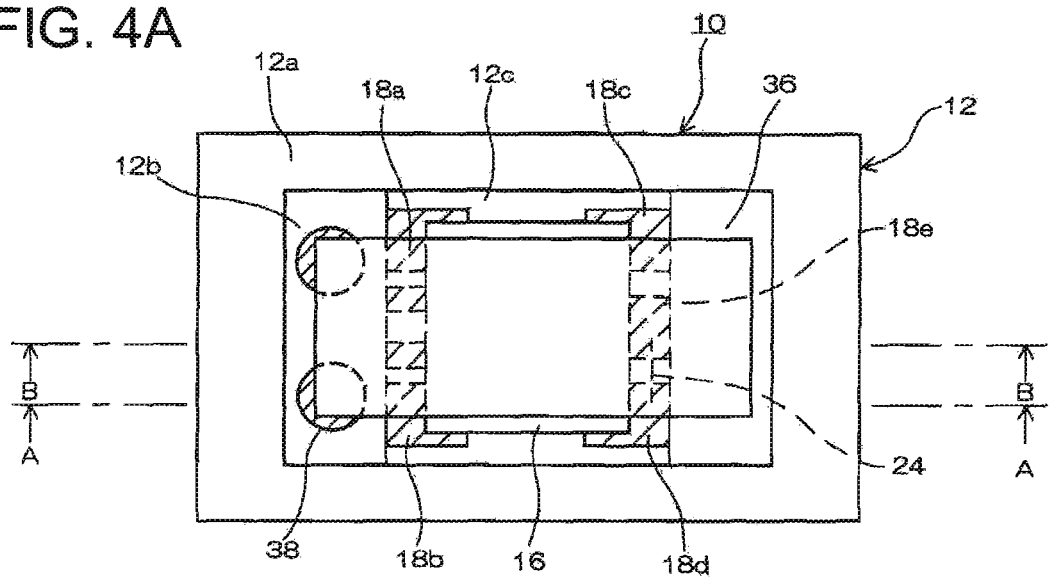
FIGS. 4A to 4C are diagrams that explain an application example of a package specification.
Figure 4B:
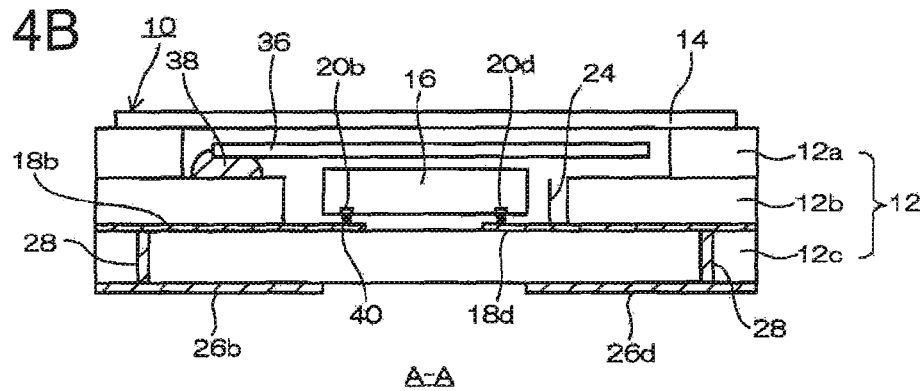
Figure 4C:
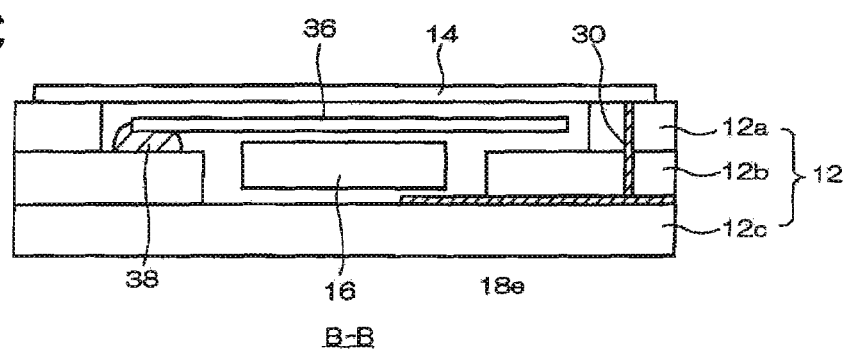

On the other hand, in case of adopting the electronic component 16 having the connection 20e other than the basic connection pads as show in FIGS. 4A to 4C, it suffices to sever (cut off) on purpose at least part of the internal terminals 18, whose partially enlarged view is shown in FIG. 3B, as shown in FIG. 3C. This enables the package 10 to obtain the same number of internal terminals 18 as the connection pads 20 provided on the electronic component 16, and the mounting terminals 26 with settings made respectively different and the lid 14 are connected to the internal terminals 18.

It should be noted that as for severing the terminals, a pattern may be shaved off by using a laser and the like. Or other methods may be used. Further, the shape of the internal terminals is not limited to what is shown in FIGS. 3A to 3C. Furthermore, in the embodiment, for the sake of simplifying explanation, the lid 14 and the mounting terminal 26d set for GND connection only are supposed to be connected to the internal terminal 18f. However, other mounting terminals 26 may be connected to the same internal terminals. In this case, sections to be severed of the internal terminal 18f may be increased and divided into the number of the internal terminals 18 corresponding to the number of connected mounting terminals 26.

In either of the above-mentioned embodiments, connection or severing is performed between the adjacent internal terminals 18, but connection and severing may be carried out between the separate internal terminals 18. However, when connection is carried out between the separate internal terminals, it is necessary to ensure no contact with other internal terminals 18, the metallic wire 22 for connection and the like.

Further, in the above-mentioned embodiments, it is described such that only the electronic component 16 is mounted inside the package 10 in all cases. But, as shown in FIGS. 4A to 4C, it may be such that a piezo-electric oscillator strip 36 is mounted to serve as a piezo-electric oscillator.

Furthermore, in the embodiments, wire bonding is carried out for all cases when mounting the electronic component 16 inside the base 12. However, as shown in FIGS. 4A to 4C, wire bonding is carried out even in case of mounting the electronic component by using flip chip bonding, and yet it is possible to employ the same configuration. It should be noted that FIG. 4A is a schematic diagram that shows a plan view of the package, FIG. 4B being a schematic diagram that shows a section along line A-A in FIG. 4A, while FIG. 1C being a schematic diagram that shows a section along line B-B in FIG. 4A.

Moreover, in the above-mentioned embodiments, the lid 14 was described as an external terminal other than a terminal for mounting. Nevertheless, for the external terminal other than the terminal for mounting, a part other than the lid 14 may be set. Even in such configuration, it remains to be a package for an electronic device according to the invention.

The entire disclosure of Japanese Patent Application No. 2005-194646, filed Jul. 4, 2005 is expressly incorporated by reference herein.

What is claimed is:

1. A package for an electronic device equipped with an external terminal other than a terminal for mounting, comprising:
   a base;
   a plurality of mounting terminals which are disposed at an outer surface of a bottom of the base;
   a first external terminal disposed on an outer surface of the package;
   a first internal terminal electrically connected to the first external terminal being disposed inner the base; and
   a second internal terminal electrically connected to one of the mounting terminals for ground connection being disposed inner the base,
   wherein the second internal terminal is selectively connected to the first internal terminal; wherein the first internal terminal and the second internal terminal are on one plane and are connected to each other by an external metallic wire.

2. A package for an electronic device equipped with an external terminal other than a terminal for mounting, comprising:
   a base;
   a plurality of mounting terminals which are disposed at an outer surface of a bottom of the base;
   a first external terminal disposed on an outer surface of the package; and a internal terminal disposed inner the base which is selectively divided to a first internal terminal electrically connected to the first external terminal and a second internal terminal connected to one of the mounting terminals for ground connection, wherein the first internal terminal and the second internal terminal are on the same plane.

3. The package for an electronic device according to claim 1, the first external terminal being set as a lid for the package.

4. A method for manufacturing an electronic device using a package for an electronic device comprising:

selectively implementing, corresponding to a specification of an electronic component to be mounted inside the package, an electrical connection between an electronic component and a first internal terminal electrically connected to an external terminal other than the terminal for mounting, and an electrical connection between an first internal terminal electrically connected to an external terminal other than the terminal for mounting and the second internal terminal electrically connected to the external terminal for mounting for ground connection; wherein the first internal terminal and the second internal terminal are on one plane and are connected to each other by an external metallic wire.

* * * * *